（12）United States Patent
Onishi

(10) Patent No.: US 8,742,500 B2
(45) Date of Patent: Jun. 3, 2014

(54) SEMICONDUCTOR DEVICE

(75) Inventor: Yasuhiko Onishi, Matsumoto (JP)

(73) Assignee: Fuji Electric Co., Ltd (JP)

( * ) Notice: Subject to any disclaimer, the term of this patent is extended or adjusted under 35 U.S.C. 154(b) by 81 days.

(21) Appl. No.: 13/273,544

(22) Filed: Oct. 14, 2011

(65) Prior Publication Data
US 2012/0098064 A1 Apr. 26, 2012

(30) Foreign Application Priority Data

Oct. 21, 2010 (JP) .................................. 2010-236394

(51) Int. Cl.
H01L 29/66 (2006.01)

(52) U.S. Cl.
USPC ........... 257/341; 257/127; 257/170; 257/181; 257/288; 257/350; 257/409; 257/605; 257/E29.012; 257/E29.013

(58) Field of Classification Search
USPC ......... 257/127, 170, 181, 288, 341, 350, 409, 257/457, 459, 484, 605, E29.012, E29.013
See application file for complete search history.

(56) References Cited

U.S. PATENT DOCUMENTS

| 5,629,552 | A * | 5/1997 | Zommer ........................ 257/490 |
| 7,642,597 | B2 * | 1/2010 | Saito .............................. 257/341 |
| 7,671,410 | B2 * | 3/2010 | Zhao et al. ..................... 257/342 |
| 7,915,705 | B2 * | 3/2011 | Yamamoto et al. ........... 257/496 |
| 2002/0068404 | A1 * | 6/2002 | Zommer ........................ 438/268 |
| 2002/0088990 | A1 | 7/2002 | Iwamoto et al. |
| 2003/0132450 | A1 * | 7/2003 | Minato et al. ................. 257/110 |
| 2008/0169526 | A1 | 7/2008 | Wakimoto et al. |

FOREIGN PATENT DOCUMENTS

| JP | 2002-134748 A | 5/2002 |
| JP | 2003-115589 A | 4/2003 |
| JP | 2004-072068 A | 3/2004 |
| JP | 2004-134714 A | 4/2004 |
| JP | 2008-193043 A | 8/2008 |
| JP | 2009-117715 A | 5/2009 |

* cited by examiner

Primary Examiner — Michelle Mandala
(74) Attorney, Agent, or Firm — Rossi, Kimms & McDowell LLP

(57) ABSTRACT

A semiconductor device is disclosed wherein a peripheral region with a high breakdown voltage and high robustness against induced surface charge is manufactured using a process with high mass productivity. The device has n-type drift region and p-type partition region of layer-shape deposited in a vertical direction to one main surface of n-type semiconductor substrate with high impurity concentration form as drift layer, alternately adjacent parallel pn layers in a direction along one main surface. Active region through which current flows and peripheral region enclosing the active region include parallel pn layers. P-type partition region has impurity concentration distribution where concentration decreases from surface toward substrate side, n-type surface region disposed on parallel pn layers in peripheral region, p-type guard rings disposed separately from each other on n-type surface region, and field plate disposed on inner and outer circumferential sides of p-type guard rings, and electrically connected.

7 Claims, 18 Drawing Sheets

SEMICONDUCTOR DEVICE

BACKGROUND OF THE INVENTION

A. Field of the Invention

The present invention relates to a superjunction semiconductor device with a high breakdown voltage and high current capacity applicable to a MOSFET (metal oxide semiconductor field effect transistor), IGBT (insulated gate bipolar transistor), bipolar transistor, or the like, and to a manufacturing method of the device. In the following description, the superjunction semiconductor device refers to a semiconductor device wherein a drift layer, in which a p-type region and n-type region of a column-shape or layer-shape deposited in a vertical direction to a main surface of a semiconductor substrate form alternately adjacent parallel pn layers in a direction along the main surface, has a function to flow a current in an "on" state and to hold a breakdown voltage in an "off" state.

B. Description of the Related Art

In general, semiconductor devices are classified into a lateral semiconductor device that has an electrode on only one surface of a semiconductor substrate where a current flows along a main surface, and a vertical semiconductor device that has electrodes on both surfaces of a semiconductor substrate where a current flows between electrodes on main surfaces. In the vertical semiconductor device, the direction in which a drift current flows in the "on" state of the device is the same as the direction in which a depletion layer extends due to a reverse bias voltage in the "off" state of the device. In the case of a conventional planar n-channel vertical MOSFET, a high resistivity n-drift layer works for flowing a drift current in a vertical direction in the "on" state of the MOSFET, and is depleted in the "off" state to hold a breakdown voltage. Shortening the current path of the high resistivity n-drift layer, that is, making the high resistivity n-drift layer thinner, leads to an effect of lowering the on-resistance of the MOSFET due to the decreased resistance in the n-drift layer. However, as the width of a depletion layer spreading from a pn junction between a p-type base region and the n-drift layer decreases, the electric field strength quickly reaches the critical electric field of silicon and the breakdown voltage decreases. On the other hand, an n-channel vertical MOSFET with a high breakdown voltage has a thick n-drift layer and the thick n-drift layer leads to a high on-resistance, and the conduction loss of the MOSFET increases. This relationship between the on-resistance and the breakdown voltage is called a trade-off relationship. It is known that this trade-off relationship exists in semiconductor devices such as an IGBT, bipolar transistor, or diode as well.

Meanwhile, in order to realize a high breakdown voltage in a vertical semiconductor device, the device needs a peripheral region in a ring shape surrounding an active region through which a current flows. Without this peripheral region, it is difficult to realize the high breakdown voltage, because an electric field strength becomes high in the outer region of the drift layer, which leads to the breakdown voltage decrease. Also, even though the breakdown voltage is initially maintained, the device with low robustness against surface charge is difficult to guarantee the reliability of the breakdown voltage. The surface charge on the peripheral region affects the extension of the depletion layer, which results in the breakdown voltage decrease with the passage of time. Hereafter, a semiconductor device with high robustness against surface charge refers to the semiconductor device in which the initial breakdown voltage is maintained even with the passage of time, that is, the semiconductor device with high reliability. In order to solve the problem of the breakdown voltage decrease in reliability, a semiconductor device with a guard ring connected to a forward and reverse direction Poly-Si field plate in peripheral region is generally known. Regarding the semiconductor device having this type of peripheral region, the influence on the extension of the depletion layer near the surface is weakened, even when a positive charge or a negative charge exists on the surface in the peripheral region. As a result, the breakdown voltage degradation is suppressed and the robustness against surface charge is improved.

Furthermore, it is desirable that a peripheral region is as narrow as possible in light of the efficiency of semiconductor material use because the peripheral region is an inactive region. Relating to this point, there is disclosed a semiconductor device in which the width of a peripheral region in a straight section is decreased and the area of the active region is increased commensurately by adopting the configuration with a p-type guard ring, a first field plate and a second field plate at the same electric potential in a corner section of the peripheral region (JP-A-2008-193043).

Furthermore, a semiconductor device has been disclosed in which it is possible to narrow the intervals between the plurality of field plates by adopting the configuration with a plurality of guard rings formed in a peripheral region, a polysilicon field plate placed on an insulating film in the inner and outer circumferential side of each guard ring, and an aluminum electrode connecting the guard rings and field plates (JP-A-2009-117715 (abstract and FIG. 1)).

However, with the MOSFET described in JP-A-2009-117715 (abstract and FIG. 1), although high relaxation of electric field and high robustness against induced surface charges with a narrow width in a peripheral region, it is necessary to form the p-type guard rings before forming the polysilicon field plates. In this case, in the process of forming a p-type base region and the p-type guard rings after forming a polysilicon gate and the polysilicon field plate, photolithography and ion implantation steps for forming the p-type guard rings need to be added. As these additional steps not only increase the manufacturing cost but also, as a misalignment of the p-type guard rings and polysilicon field plates is liable to occur, become a cause of a fluctuation or deterioration of the electric field relaxation capability and the low robustness against induced surface charge, it is desirable, as far as possible, that there is no additional step of this kind.

Also, with the MOSFET described in JP-A-2003-115589, when an n-type surface region with a low impurity concentration is formed on parallel pn layers with a high impurity concentration, autodoping from a substrate to the n-type surface region is unavoidable, meaning that it is difficult to control the impurity concentration of the n-type surface region. As a substrate doped with As is particularly liable to outdiffuse, there is a large effect on the impurity concentration of the n-type surface region, which is one factor in fluctuation of the impurity concentration of the n-type surface region. When the impurity concentration of the n-type surface region is not controlled, not only the maintenance of reliability on breakdown voltage, but also the maintenance of initial breakdown voltage becomes difficult.

The present invention is directed to overcoming or at least reducing the effects of one or more of the problems set forth above.

SUMMARY OF THE INVENTION

A superjunction semiconductor device according to the invention provides a peripheral region with a high breakdown voltage and high robustness against induced surface charge using a process with high mass productivity.

One aspect of the invention is a semiconductor device, wherein n-type drift regions 1 and p-type partition regions 2 of column-shape or layer-shape in a vertical direction to a main surface of n-type semiconductor substrate 11 with a high impurity concentration, form as a drift layer alternately adjacent parallel pn layers Z in a direction along the main surface, wherein the parallel pn layers Z serve to flow current in an "on" state and to hold a breakdown voltage in an "off" state, and active region 100 through which the current flows and peripheral region 200 which surrounds the active region 100 and holds the breakdown voltage include parallel pn layers Z, the device including parallel pn layers Z wherein p-type partition region 2 of the parallel pn layers Z has an impurity concentration distribution such that the impurity concentration decreases from the surface of the pn layers Z toward the semiconductor substrate 11, n n-type surface region 31 disposed on the parallel pn layers in peripheral region 200 in a direction along the main surface, two or more p-type guard rings 32 disposed separately from each other on n-type surface region 31, and conductive field plate 33 positioned on the inner and outer circumferential sides of p-type guard rings 32, and electrically connected to the surface of p-type guard rings 32. Also, it is preferable that the pn layer pitch width of the parallel pn layers Z in peripheral region 200 is smaller than that of the parallel pn layers Z in active region 100. Furthermore, it is also preferable that the thickness of n-type surface region 31 disposed on the parallel pn layers in peripheral region 200 is one third or less of the thickness of the parallel pn layers Z in active region 100. Furthermore, it is desirable that the impurity concentration of n-type surface region 31 disposed on the parallel pn layers in peripheral region 200 is any impurity concentration in the range from $2\times10^{14}/cm^3$ to $8\times10^{14}/cm^3$.

According to the invention, it is possible to provide a semiconductor device wherein a peripheral region structure with a high breakdown voltage and high robustness against induced surface charge is manufactured using a process with high mass productivity.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
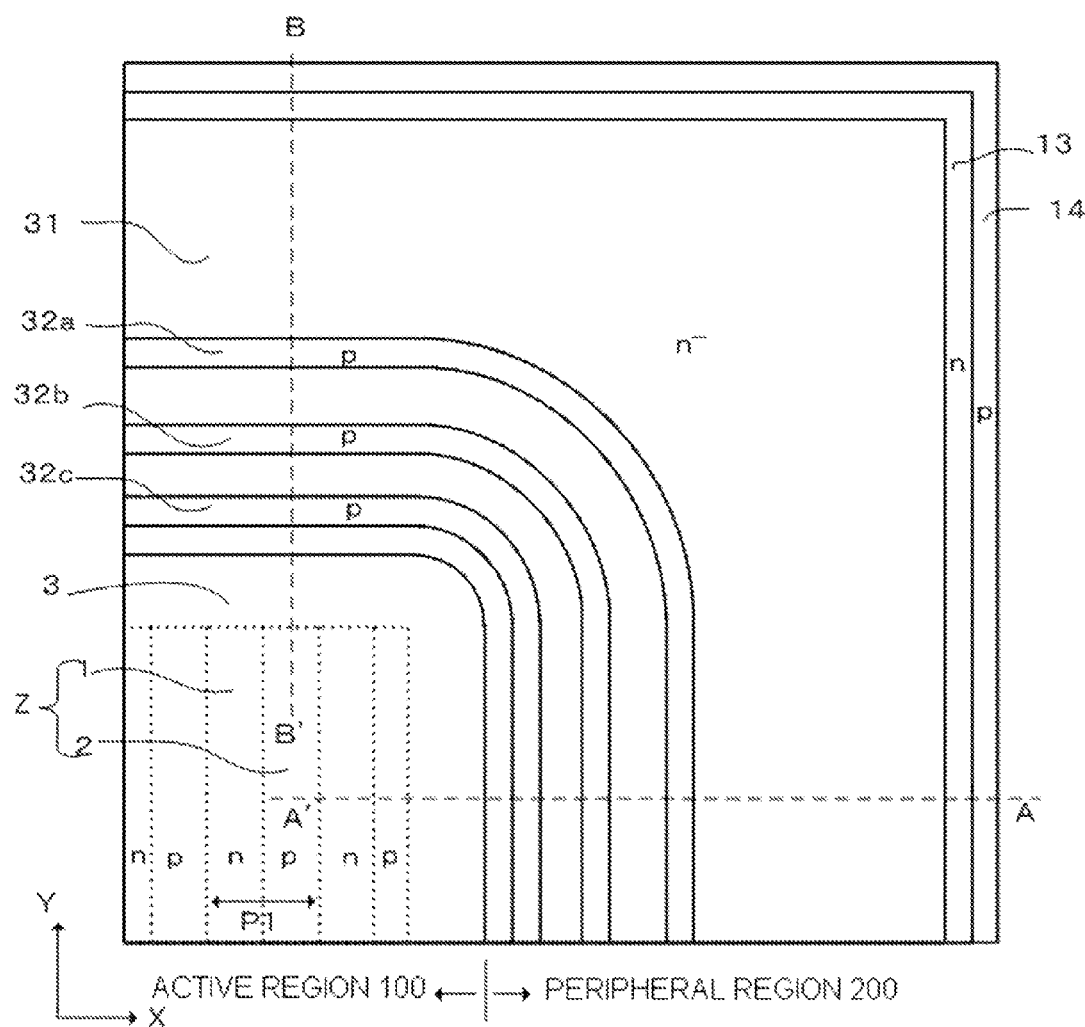
FIG. 1 is a plan view of a vertical MOSFET according to Embodiment 1 of a semiconductor device of the invention.

Hereafter, a detailed description will be given, referring to the drawings, of embodiments relating to a semiconductor device of the invention. The invention, provided that the scope thereof is not departed from, is not limited to the contents of the embodiments described hereafter. Although the following description will be given with a first conductivity type as an n-type and a second conductivity type as a p-type, it is also possible to reverse the n-type and p-type. The + and − reference symbols suffixed to n or p indicate that the impurity concentration of the n-type or p-type is a relatively high concentration or low concentration, respectively.

Embodiment 1

Figure 2:
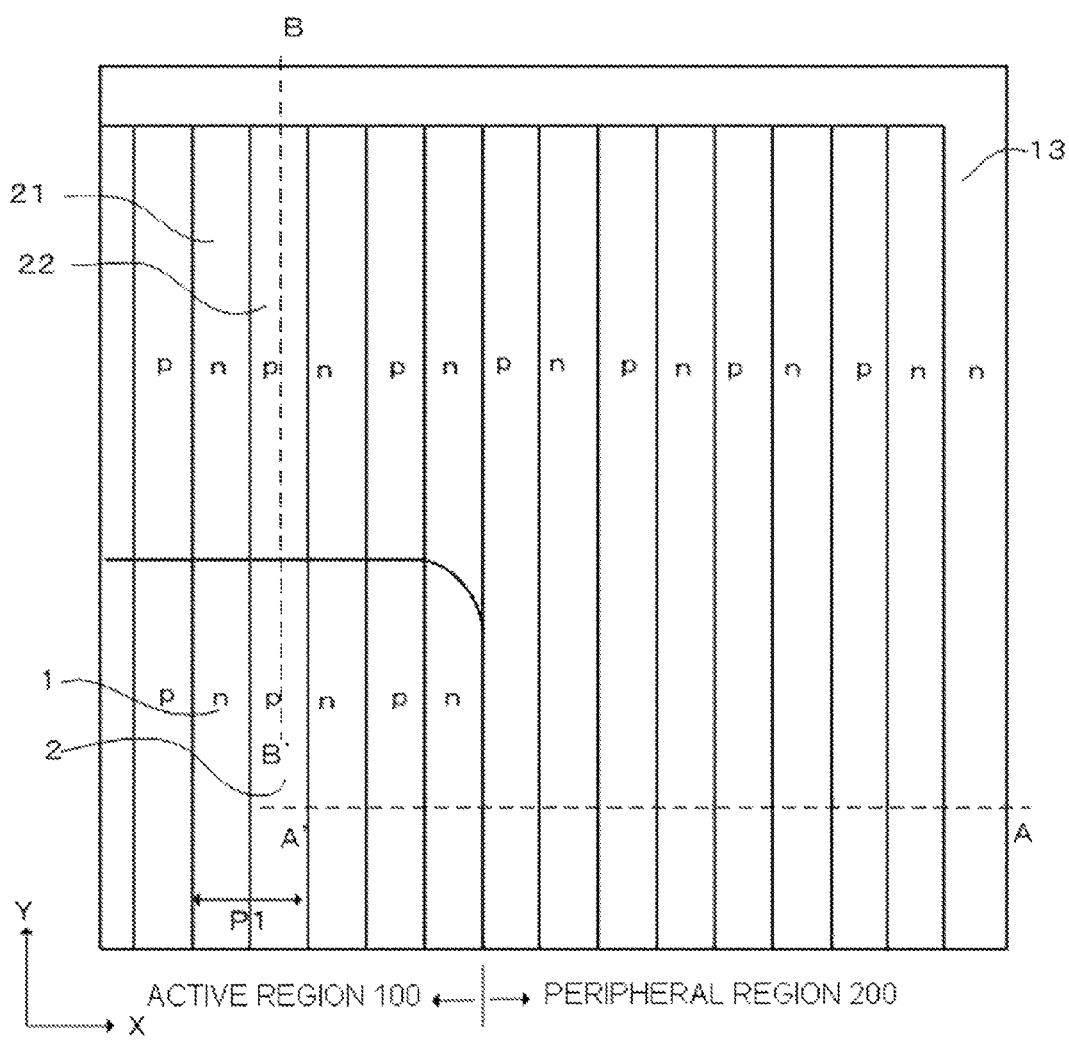
FIG. 2 is a plan view at a half of the depth from the surface of FIG. 1 according to the invention.
Figure 3:
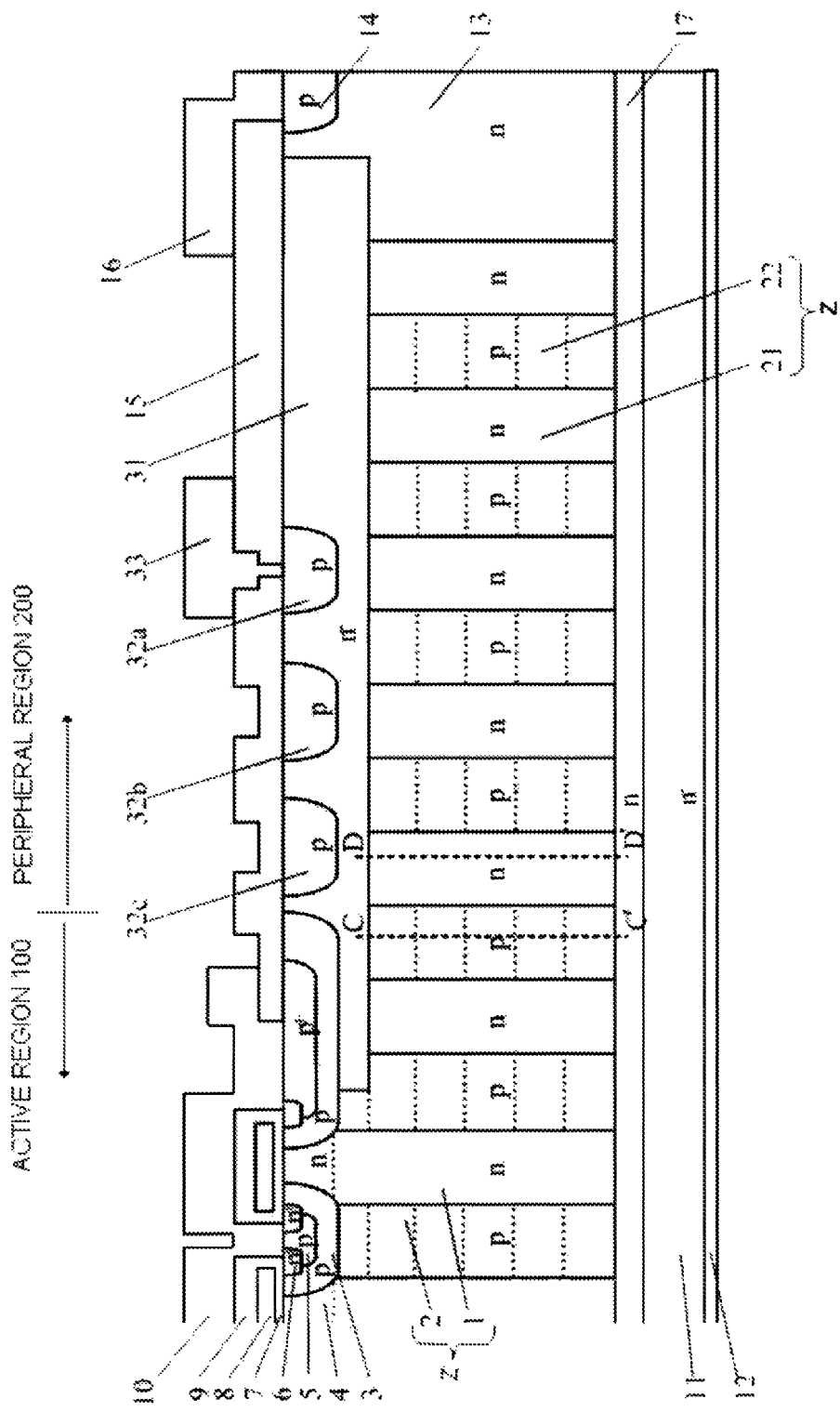
FIG. 3 is a sectional view cut along the line A-A' of FIG. 1 according to the invention.

FIGS. 1 and 2 are one quarter plan views of a vertical superjunction MOSFET according to Embodiment 1. In FIG. 1, for ease of understanding, parallel pn layers Z, n-type surface region 31, and n-type channel stopper region 13 of the outermost surface, and p-base region 3 and p-type guard rings 32a, 32b, and 32c of the outermost periphery of active region 100, are shown. Rectangular regions indicated by the dotted lines in p-base region 3 show the parallel pn layers Z below p-base region 3. Surface n-type drift layer 4, $p^+$ contact region 5, n-type source region 6, gate insulating film 7, gate electrode 8, interlayer insulating film 9, source electrode 10, field insulating film 15, channel stopper electrode 16, field plate 33, and the like, are not shown in FIG. 1. These are shown in FIG. 3. Also, high concentration semiconductor substrate 11, n-type buffer layer 17 formed by epitaxial growth with a uniform impurity concentration on the front surface of high concentration semiconductor substrate 11, and drain electrode 12 formed on the back surface of high concentration semiconductor substrate 11, are provided in FIG. 3. The parallel pn layers Z of active region 100 have a striped plan view shape, and the outer sides of parallel pn layers Z of active region 100 are enclosed by n-type surface region 31 having guard rings 32a, 32b, and 32c, disposed separately from each other in n-type surface region 31, and the outermost periphery of n-type surface region 31 is enclosed by n-type channel stopper region 13 and p-type surface region 14.

Figure 4:
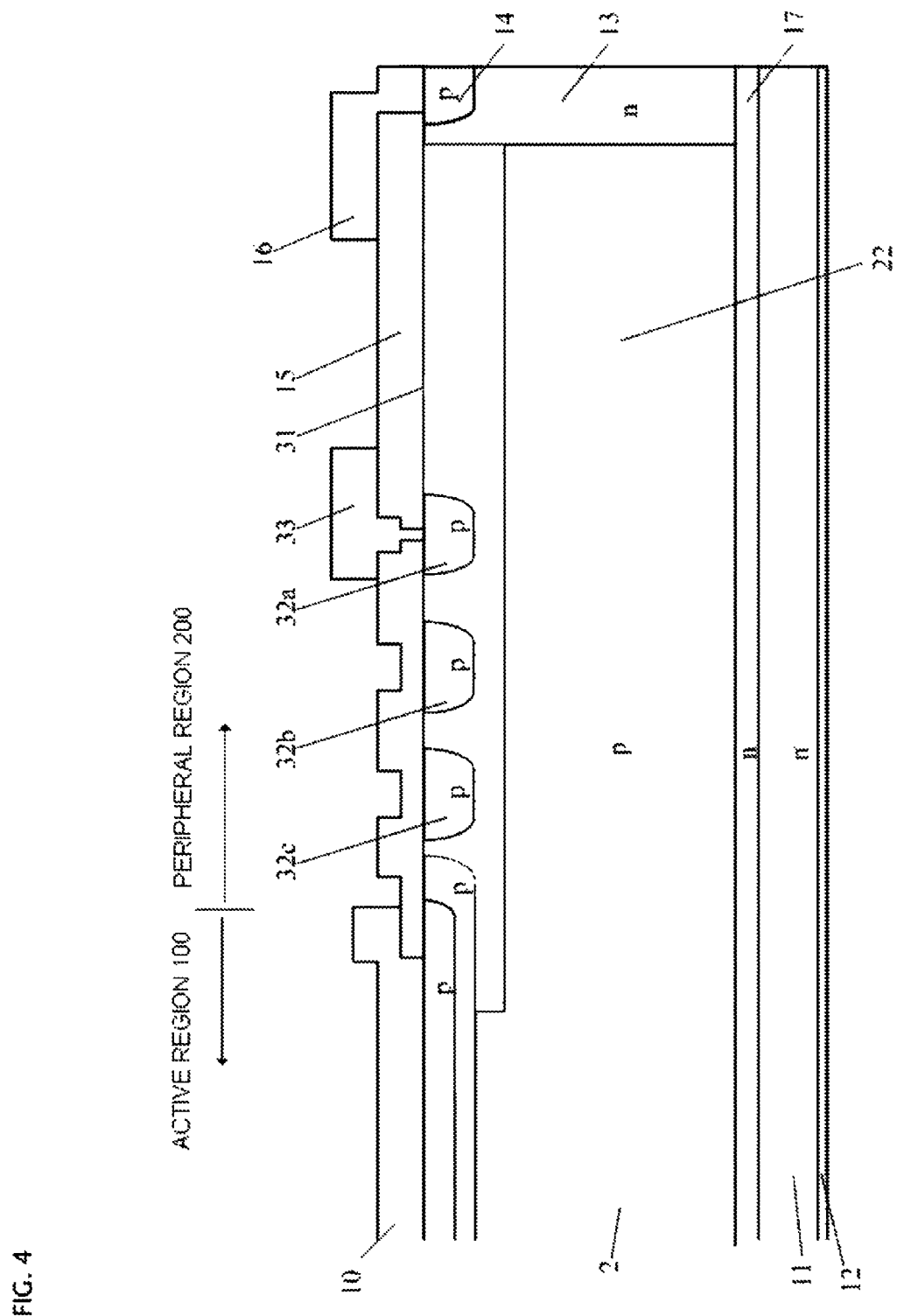
FIG. 4 is a sectional view cut along the line B-B' of FIG. 1 according to the invention.
Figure 5:
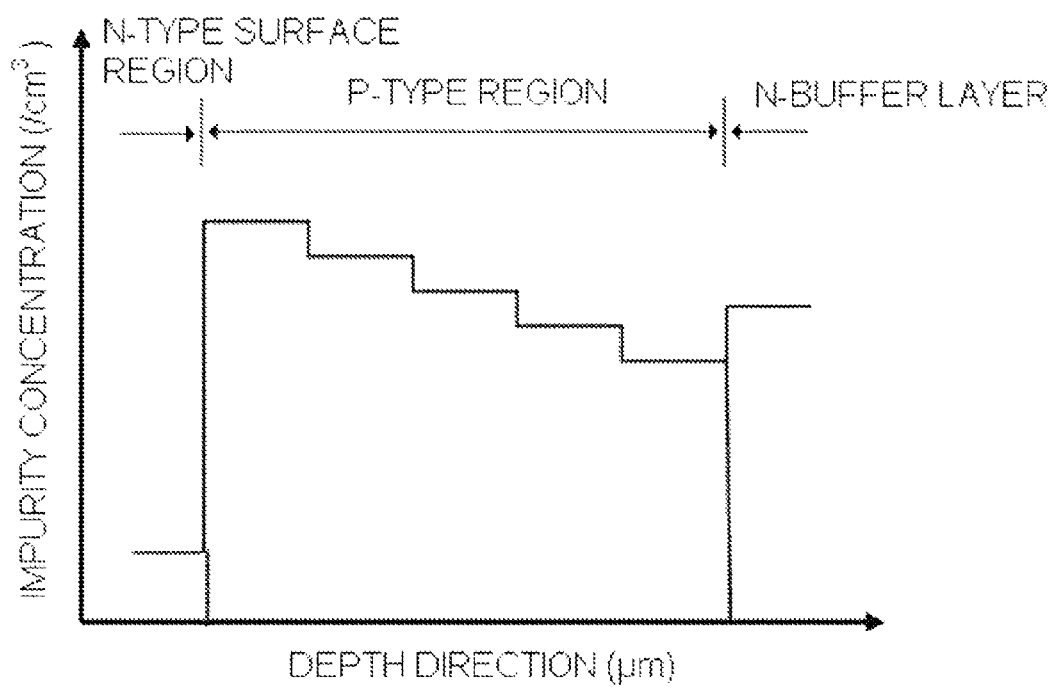
FIG. 5 is an impurity concentration profile cut along the line C-C' of FIG. 3 according to the invention.
Figure 6:
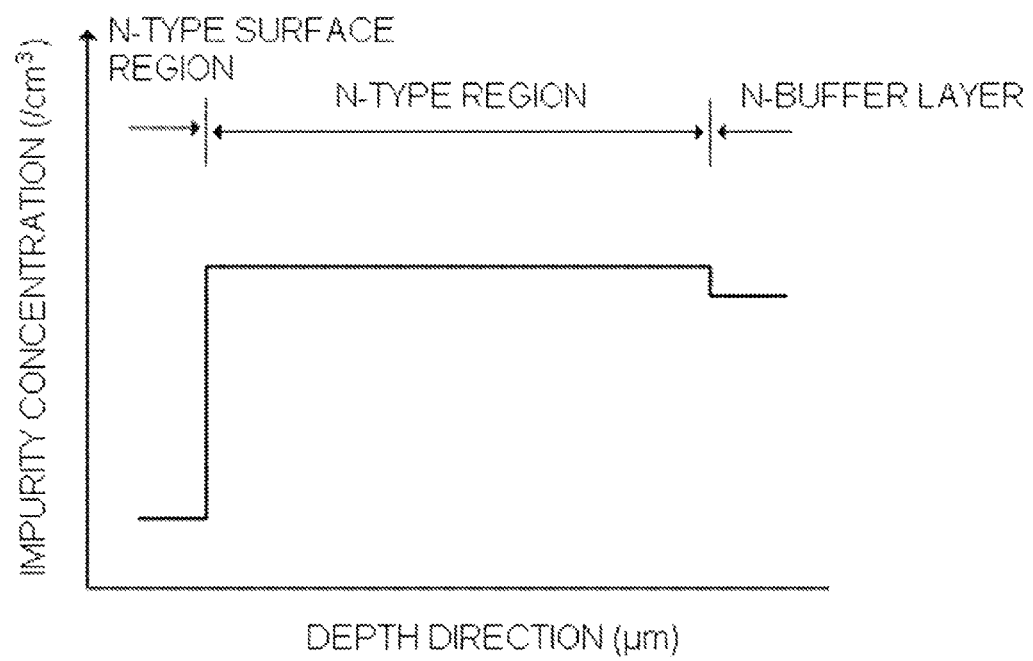
FIG. 6 is an impurity concentration profile cut along the line D-D' of FIG. 3 according to the invention.

Meanwhile, FIG. 2 shows one portion (a quarter) of a sectional view of a plane parallel to a main surface in the vicinity of a half of the depth of the parallel pn layers. It is shown that, in the vicinity of a half of the depth of the parallel pn layers, parallel pn layers with the same pitch as the parallel pn layers (pitch: P1) of active region 100 are also disposed in peripheral region 200. FIGS. 3 and 4 are sectional views cut along the line A-A' and B-B' in FIGS. 1 and 2. As shown in FIG. 3, n-type surface region 31 is disposed on the parallel pn layers in peripheral region 200, and parallel pn layers Z with the same pitch as the parallel pn layers Z of active region 100 are disposed below n-type surface region 31. P-type partition regions 2 and 22 of the parallel pn layers Z form an impurity concentration profile wherein the impurity concentration decreases from the front surface side toward the back surface side, and act in such a way as to relax the electric field, even when the impurity concentration of n-type surface region 31 increases (the smaller the thickness of the n-type surface region 31, the greater the relaxation effect on the electric field of n-type surface region 31. The relaxation effect on the electric field of n-type surface region 31 is particularly great when the thickness of n-type surface region 31 is less than one third of the thickness of the parallel pn layers). FIGS. 5 and 6 show the impurity concentration profiles cut along the line C-C' and D-D' shown in FIG. 3. P-type partition regions 2 and 22 are set in such a way that the impurity concentrations thereof are higher than those of adjacent n-type drift regions 1 and 21 at the front surface side, and contrarily, lower at the back surface side. Meanwhile, n-type drift regions 1 and 21 form a uniform impurity concentration profile regardless of the depth thereof.

The vertical superjunction MOSFET according to Embodiment 1 exhibits the breakdown voltage of a 600 V class, and the dimensions, impurity concentration, and the like, of each portion have the following kinds of value. The thickness of the drift layer is 44.0 µm, n-type drift region 1 of active region 100 has a width of 6.0 µm and an impurity concentration of $3.0 \times 10^{15}$ cm$^{-3}$, p-type partition region 2 has a width of 6.0 µm (parallel pn layers pitch 12.0 µm) and impurity concentrations of, from the back surface side, $2.4 \times 10^{15}$ cm$^{-3}$, $2.7 \times 10^{15}$ cm$^{-3}$, $3.0 \times 10^{15}$ cm$^{-3}$, $3.3 \times 10^{15}$ cm$^{-3}$, and $3.6 \times 10^{15}$ cm$^{-3}$, n-type drift region 21 of peripheral region 200 has a width of 6.0 µm and an impurity concentration of $3.0 \times 10^{15}$ cm$^{-3}$, p-type partition region 22 has a width of 6.0 µm (parallel pn layers pitch 12.0 µm) and impurity concentrations of, from the back surface side, $2.4 \times 10^{15}$ cm$^{-3}$, $2.7 \times 10^{15}$ cm$^{-3}$, $3.0 \times 10^{15}$ cm$^{-3}$, $3.3 \times 10^{15}$ cm$^{-3}$, and $3.6 \times 10^{15}$ cm$^{-3}$, and n-type surface region 31 of peripheral region 200 has an impurity concentration of $5.0 \times 10^{14}$ cm$^{-3}$ and a depth of 5.0 µm, which is less than one eighth of the 44.0 µm thickness of the drift layer, increasing the electric field relaxation effect.

Figure 12:
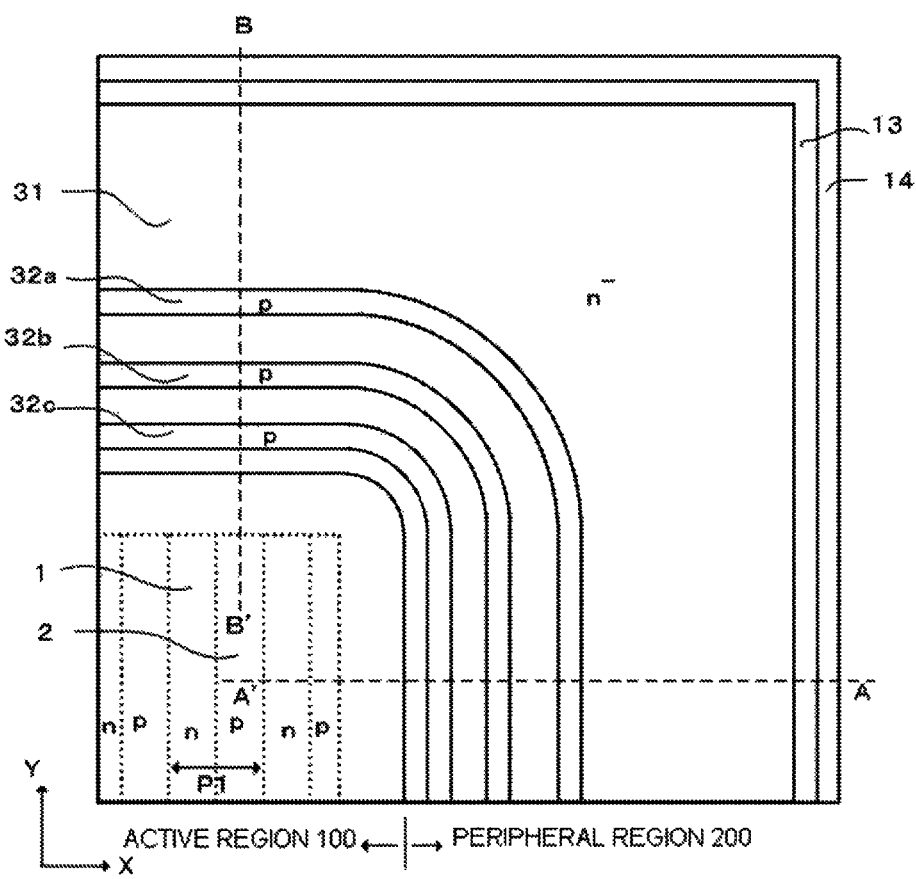
FIG. 12 is a plan view of a heretofore known vertical MOSFET.
Figure 13:
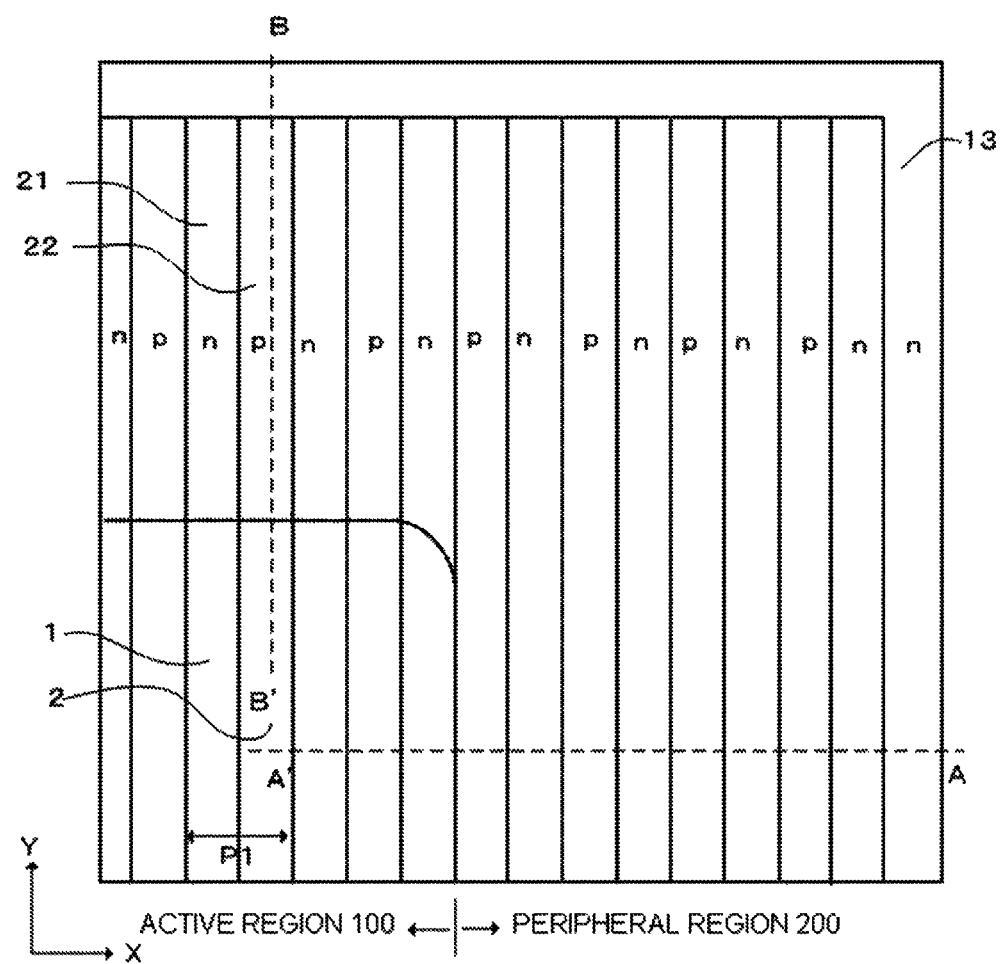
FIG. 13 is a plan view at a half of the depth from the surface of FIG. 12 according to the heretofore known vertical MOSFET.
Figure 14:
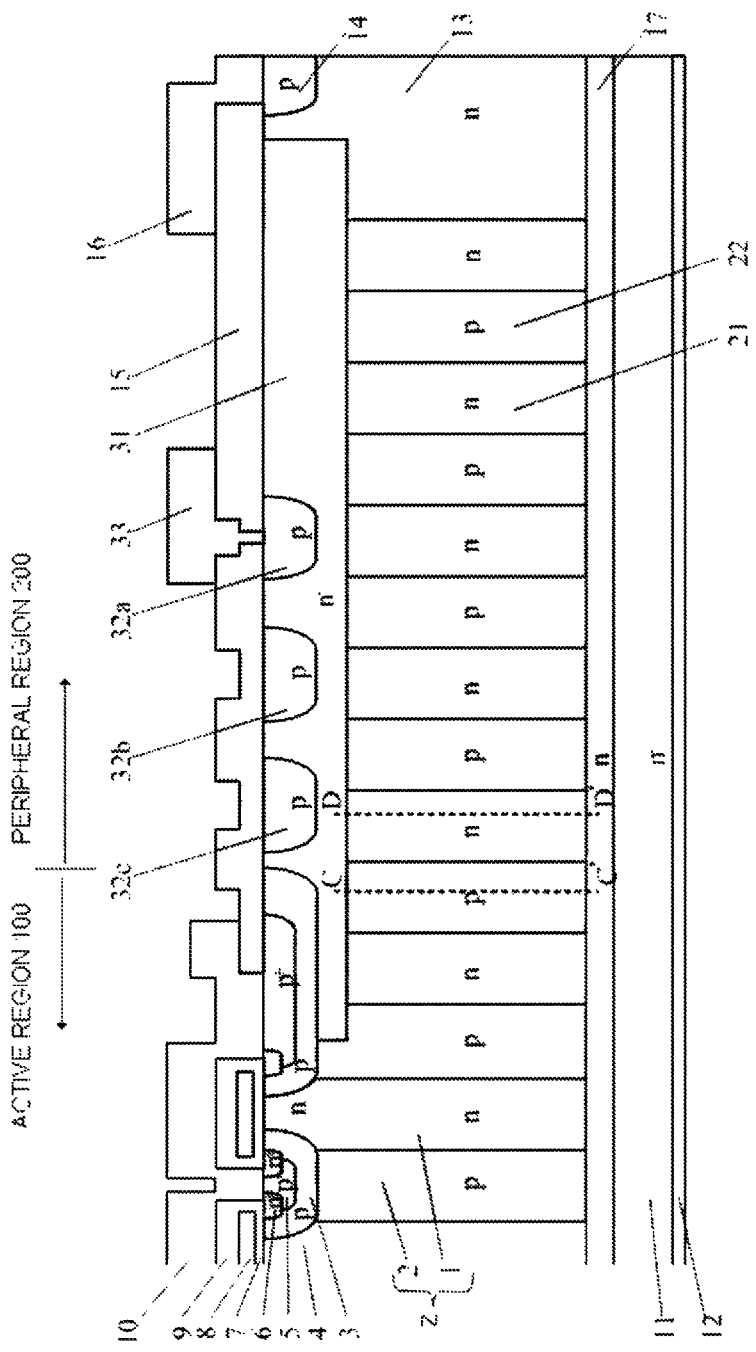
FIG. 14 is a sectional view cut along the line A-A' of FIG. 12 according to the heretofore known vertical MOSFET.
Figure 15:
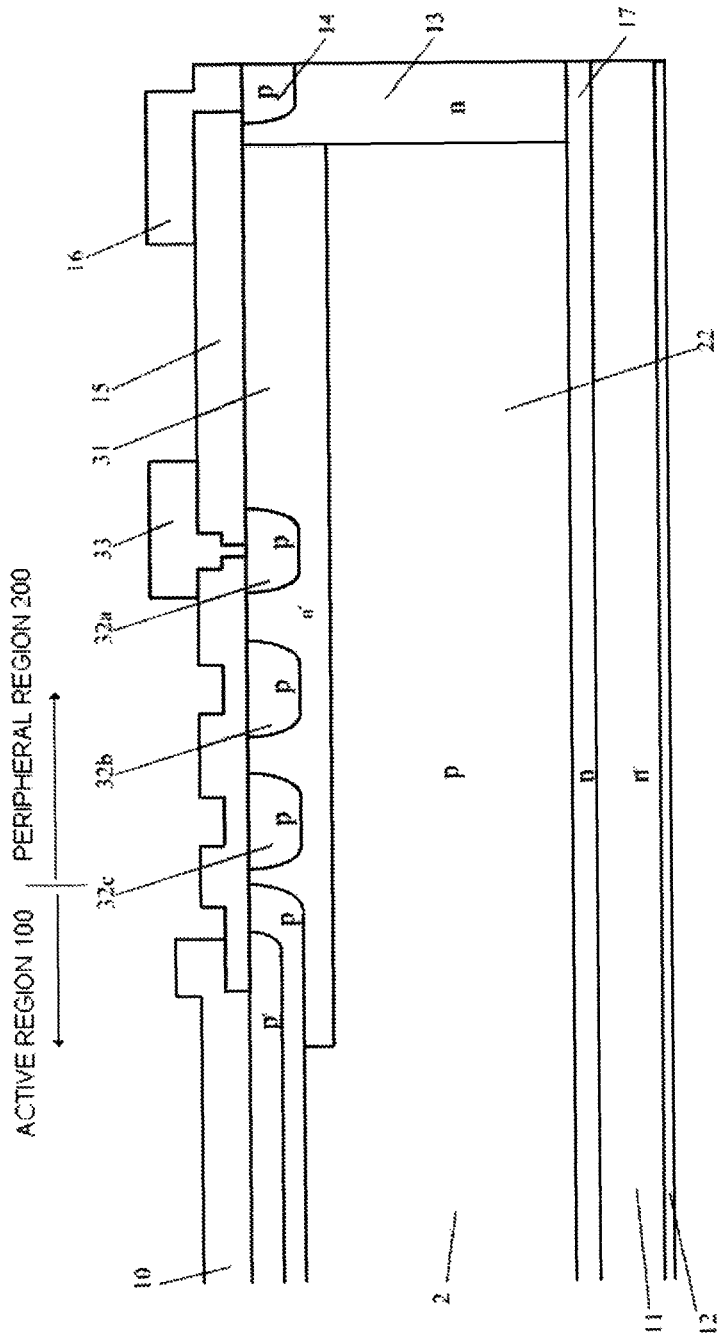
FIG. 15 is a sectional view cut along the line B-B' of FIG. 12 according to the heretofore known vertical MOSFET.
Figure 16:
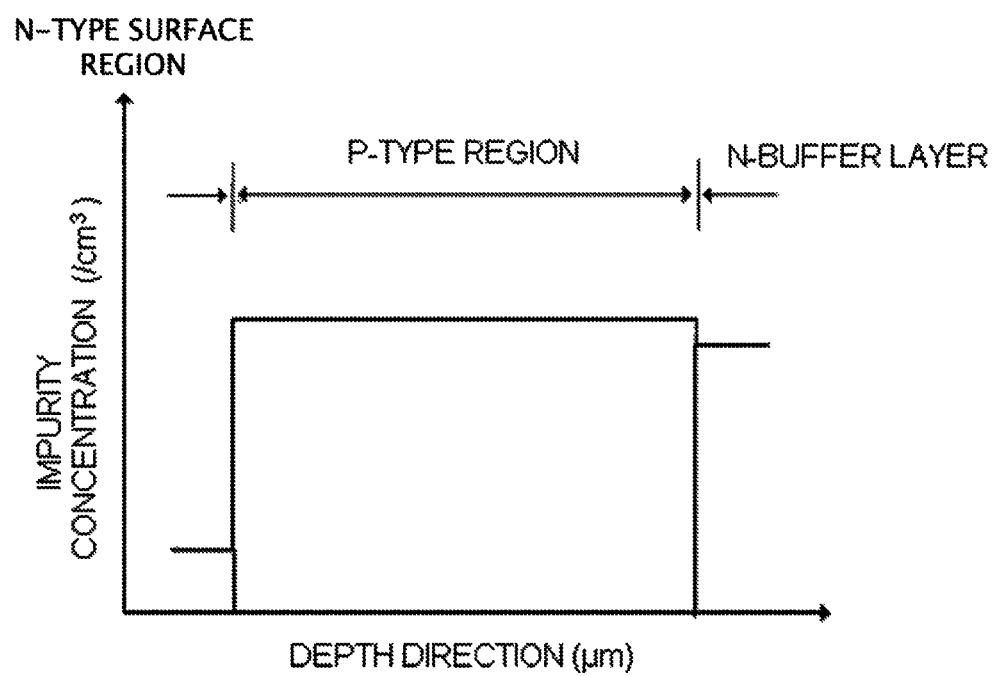
FIG. 16 is an impurity concentration profile cut along the line C-C' of FIG. 12 according to the heretofore known vertical MOSFET.
Figure 17:
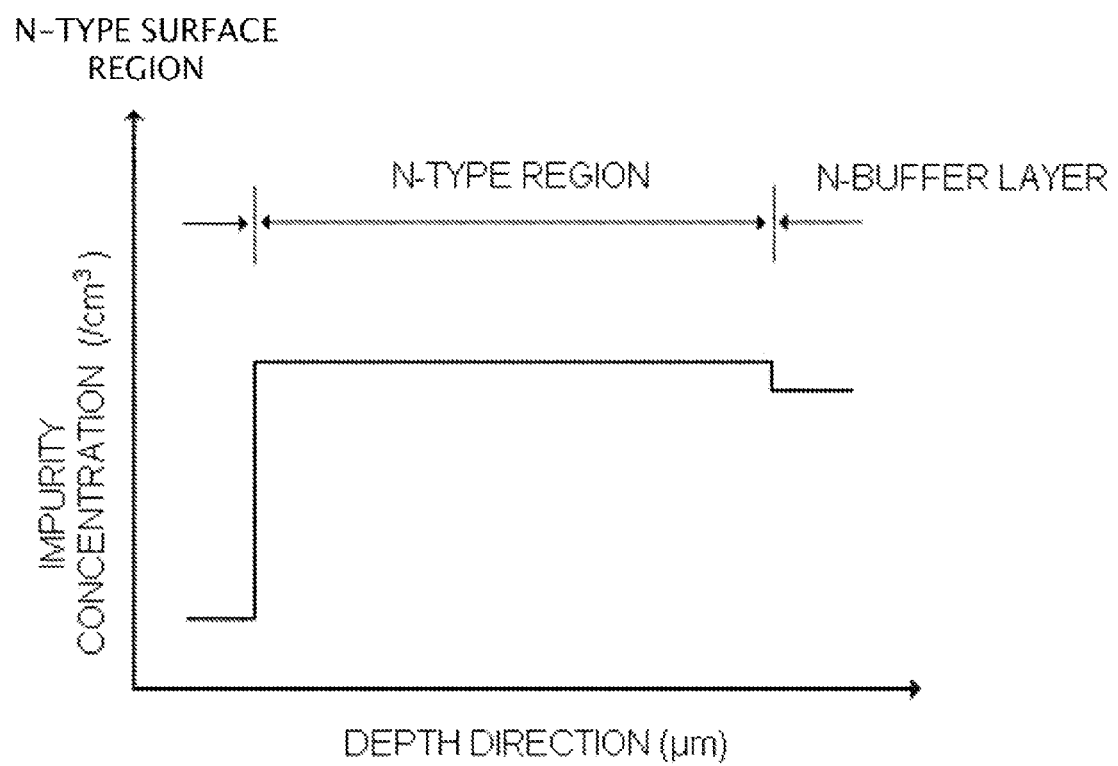
FIG. 17 is an impurity concentration profile cut along the line D-D' of FIG. 12 according to the heretofore known vertical MOSFET.

Herein, a description will be given of the robustness against induced surface charge of a peripheral region in a heretofore known structure shown in FIGS. 12 to 15. FIG. 12 is a plan view of a heretofore known vertical MOSFET. FIG. 13 is a plan view at a half depth from the surface of FIG. 12. FIG. 14 is a sectional view cut along the line A-A' of FIG. 12, but portions from FIG. 12 are omitted for ease of understanding, in the same way as in the descriptions of FIGS. 1 and 3, are also shown. FIG. 15 is a sectional view cut along the line B-B' of FIG. 12. As it is difficult for the depletion layer of n-type surface region 31 to spread when a positive charge (positive ions) is induced on the surface of field insulating film 15 of peripheral region 200, the electric field in the outer peripheral vicinity (a p-type partition region) of active region 100 increases, but as the electric field is relaxed by disposing p-type guard rings 32a, 32b, and 32c, the breakdown voltage is able to be hold even though the positive charge (positive ions) are induced on the surface of field insulating film 15 of peripheral region 200. Meanwhile, in the case of a negative charge (negative ions), as it is easier for the depletion layer to extend in n-type surface region 31 with p-type guard rings 32a, 32b, and 32c, and between field plate 33 and channel stopper electrode 16, the depletion layer spreads into n-type channel stopper region 13 of peripheral region 200, but as a reach-through of n-type channel stopper region 13 is prevented by channel stopper electrode 16, the breakdown voltage is able to be maintained. As the electric field decreases from the outer periphery of active region 100 toward the outer periphery of peripheral region 200, it is desirable that the distance between guard rings increases as the guard rings approach the outer periphery of peripheral region 200.

Figure 18:
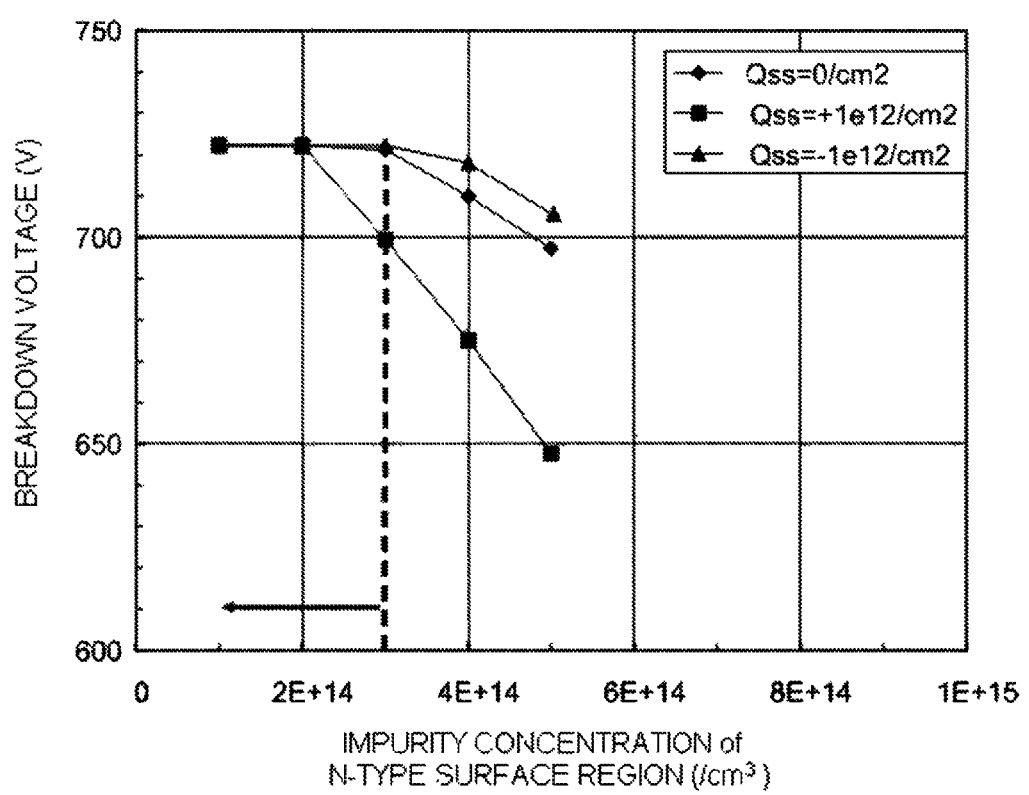
FIG. 18 is a graph showing the relationship between the breakdown voltage and the impurity concentration of n-type surface region in the heretofore known vertical MOSFET.

However, in order to obtain high breakdown voltage and high reliability, reducing the impurity concentration for the relaxation of the electric field in the n-type surface region is necessary and this makes it easier for the depletion layer to spread. When increasing the impurity concentration, there is a risk of not only the low robustness against induced surface charge but also the initial breakdown voltage decrease. FIG. 18 shows the simulated results of the dependence of breakdown voltage on the impurity concentration of n-type surface region 31 when the thickness of n-type surface region 31 is 5 µm, and there are four guard rings. A notation such as +1e12/cm$^2$ in the drawing means $+1 \times 10^{12}$ cm$^{-2}$. The initial breakdown voltage (when a surface charge Qss=0 cm$^{-2}$) begins to decrease the impurity concentration of $4 \times 10^{14}$ cm$^{-3}$ in n-type surface region 31, and the breakdown voltage decreases by 5% or more with respect to the initial breakdown voltage at a surface charge of $+1 \times 10^{12}$/cm$^{-2}$ (the + reference symbol represents a positive charge). Meanwhile, with a view to avalanche capability, the breakdown voltage of peripheral region 200 is normally designed to be a few percent higher than that of the active region so that critical electric field strength is reached first in the active region, so the breakdown voltage decrease of peripheral region 200 is tolerated to an extent. When the allowance rate for breakdown voltage decrease is 5%, it is necessary, in the heretofore known example, that n-type surface region 31 impurity concentration is $3 \times 10^{14}$ cm$^{-3}$ or lower, as shown by the broken line in FIG. 18. However, as n-type surface region 31 is formed by epitaxial growth, autodoping in the semiconductor substrate, epitaxial growth furnace, or the like, is unavoidable, and an impurity concentration control that maintains the impurity concentration at a low concentration like $3 \times 10^{14}$ cm$^{-3}$ or lower is extremely difficult in reality.

Figure 7:
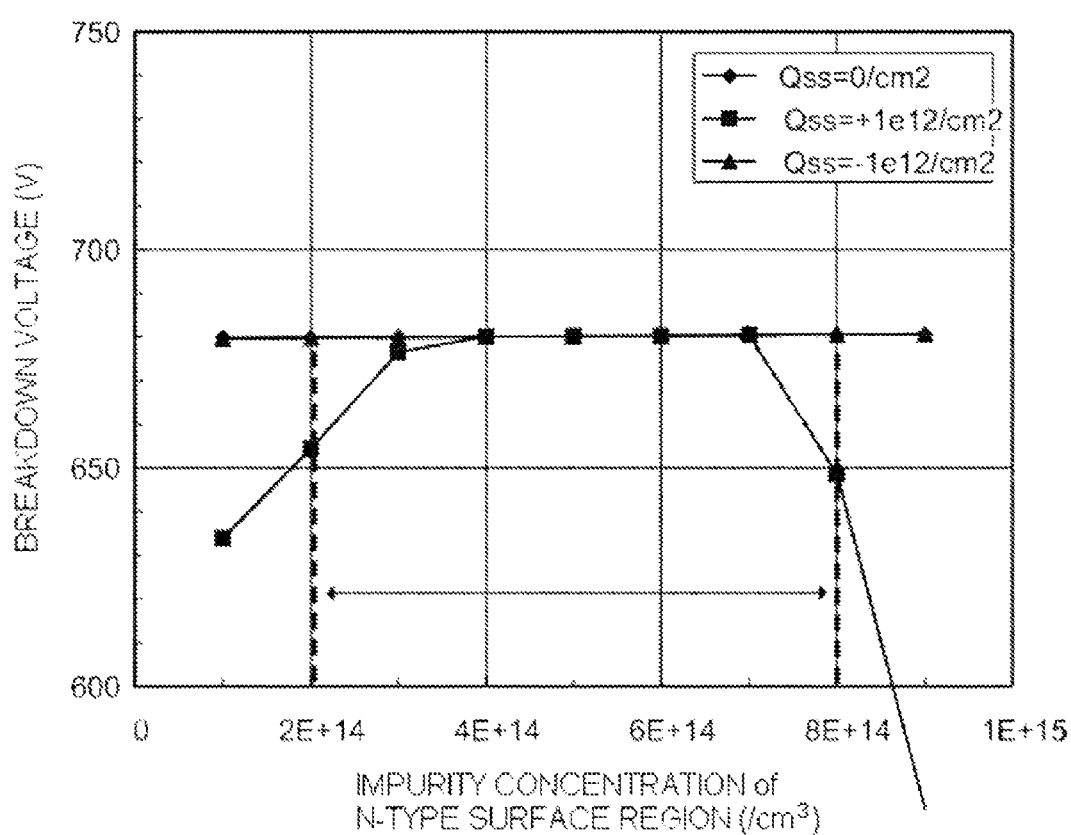
FIG. 7 is a graph showing the relationship between the breakdown voltage and the impurity concentration of n-type surface region in the vertical MOSFET according to Embodiment 1 of the semiconductor device of the invention.

Meanwhile, as the impurity concentration of n-type surface region 31 in the Embodiment is able to be increased by adopting the p-type partition regions, which have an impurity concentration gradient, the effect of autodoping is reduced. As this is because the p-type partition regions, whose impurity concentration is higher on the front surface side, act like embedded guard rings, the electric field of n-type surface region 31 is relaxed even when n-type surface region 31 impurity concentration is raised, and the breakdown voltage is maintained. FIG. 7 shows the simulated results of the dependence of breakdown voltage on the impurity concentration of the n-type surface region, as in the heretofore known example of FIG. 18. In FIG. 7, when the surface charge Qss=0 cm$^{-2}$, no decrease of the initial breakdown voltage is seen in a range of $1 \times 10^{14}$ cm$^{-3}$ to $9 \times 10^{14}$ cm$^{-3}$, but when the surface charge is $+1 \times 10^{12}$ cm$^{-3}$ (the + reference symbol represents a positive charge), the breakdown voltage decreases by 5% or more at $2 \times 10^{14}$ cm$^{-3}$ or less and $8 \times 10^{14}$ cm$^{-3}$ or more. That is, at the impurity concentration in the range from $2 \times 10^{14}$ cm$^{-3}$ to $8 \times 10^{14}$ cm$^{-3}$, the breakdown voltage decrease is kept to less than 5%. In the same way as in the heretofore known example, when the allowance rate for breakdown voltage decrease is 5%, it is possible in Embodiment 1 to arrange in such a way that there is no breakdown voltage decrease, even when significantly increasing the n-type surface region 31 impurity concentration from $3 \times 10^{14}$ cm$^{-3}$ to around $8 \times 10^{14}$ cm$^{-3}$. As a result, peripheral region 200 with high reliability and high mass productivity (little breakdown voltage fluctuation) is able to be provided as the effect of autodoping is reduced.

Embodiment 2

Figure 8:
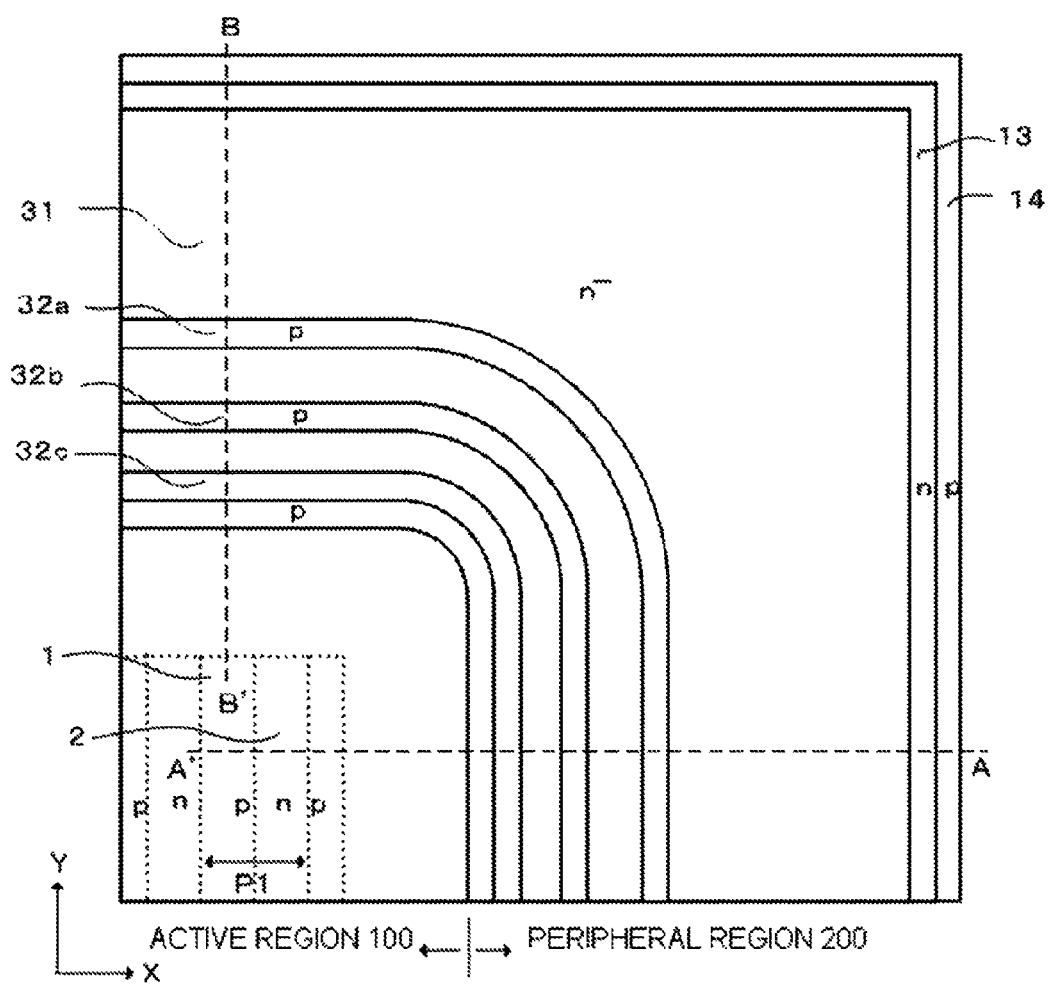
FIG. 8 is a plan view of a vertical MOSFET according to Embodiment 2 of the semiconductor device of the invention.
Figure 9:
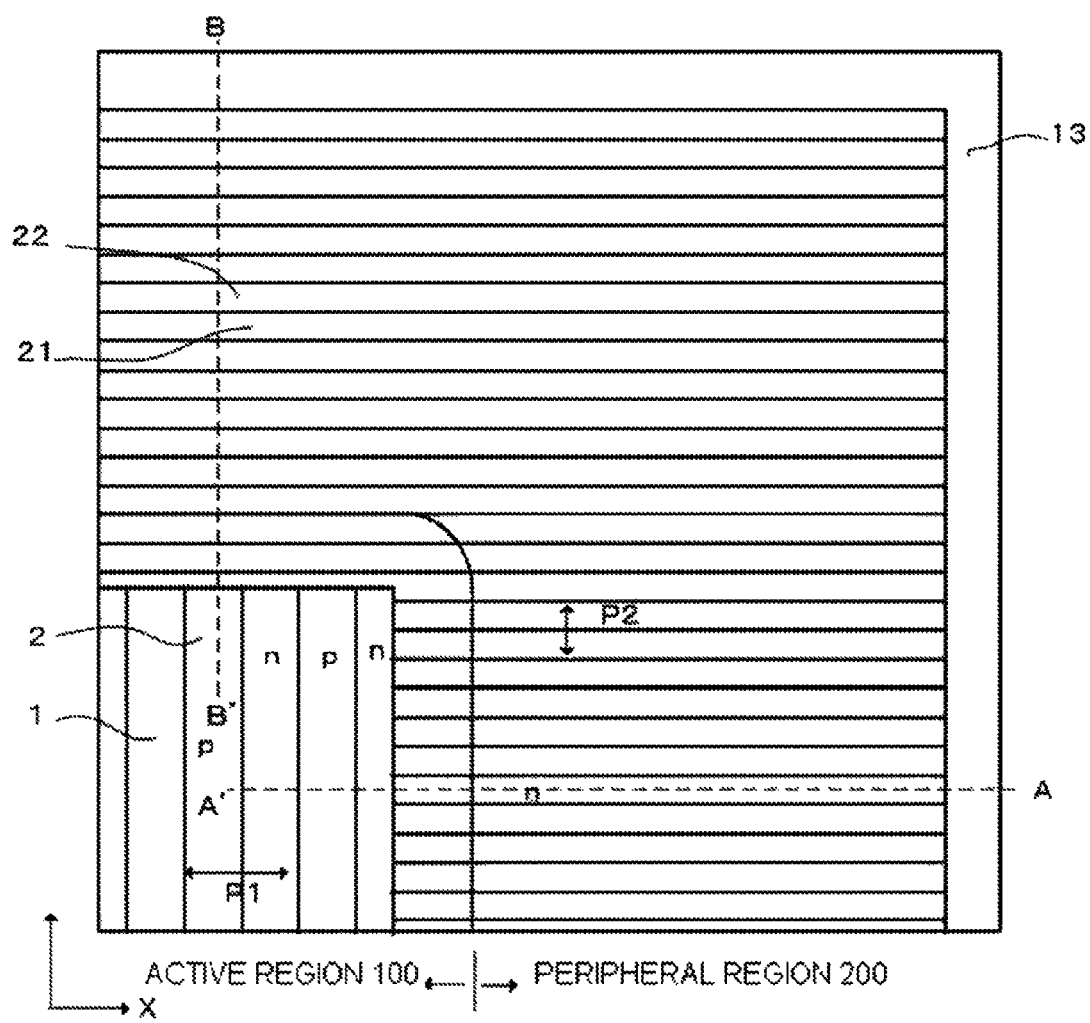
FIG. 9 is a plan view at a half of the depth from the surface of FIG. 8 according to the invention.
Figure 10:
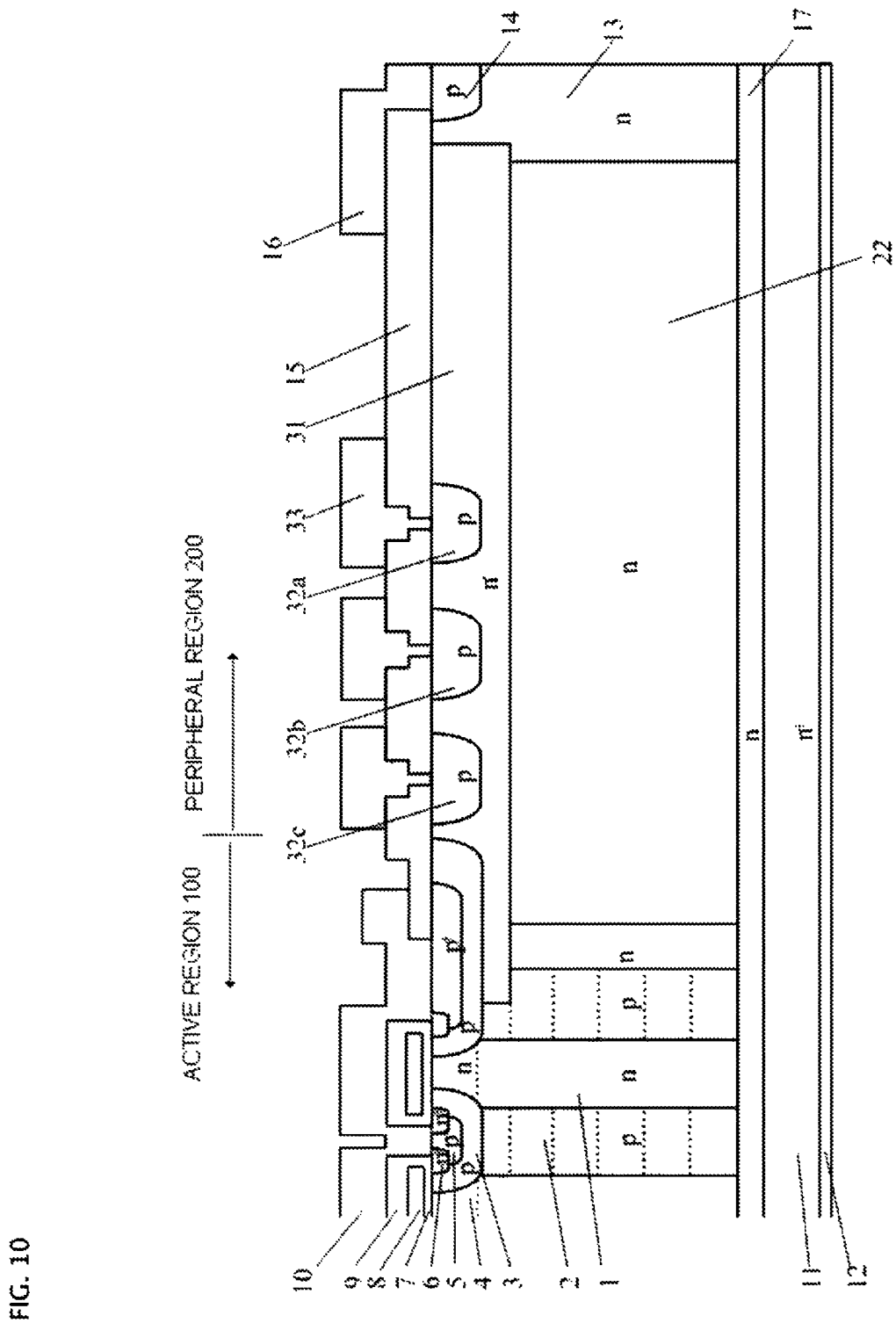
FIG. 10 is a sectional view cut along the line A-A' of FIG. 8 according to the invention.
Figure 11:
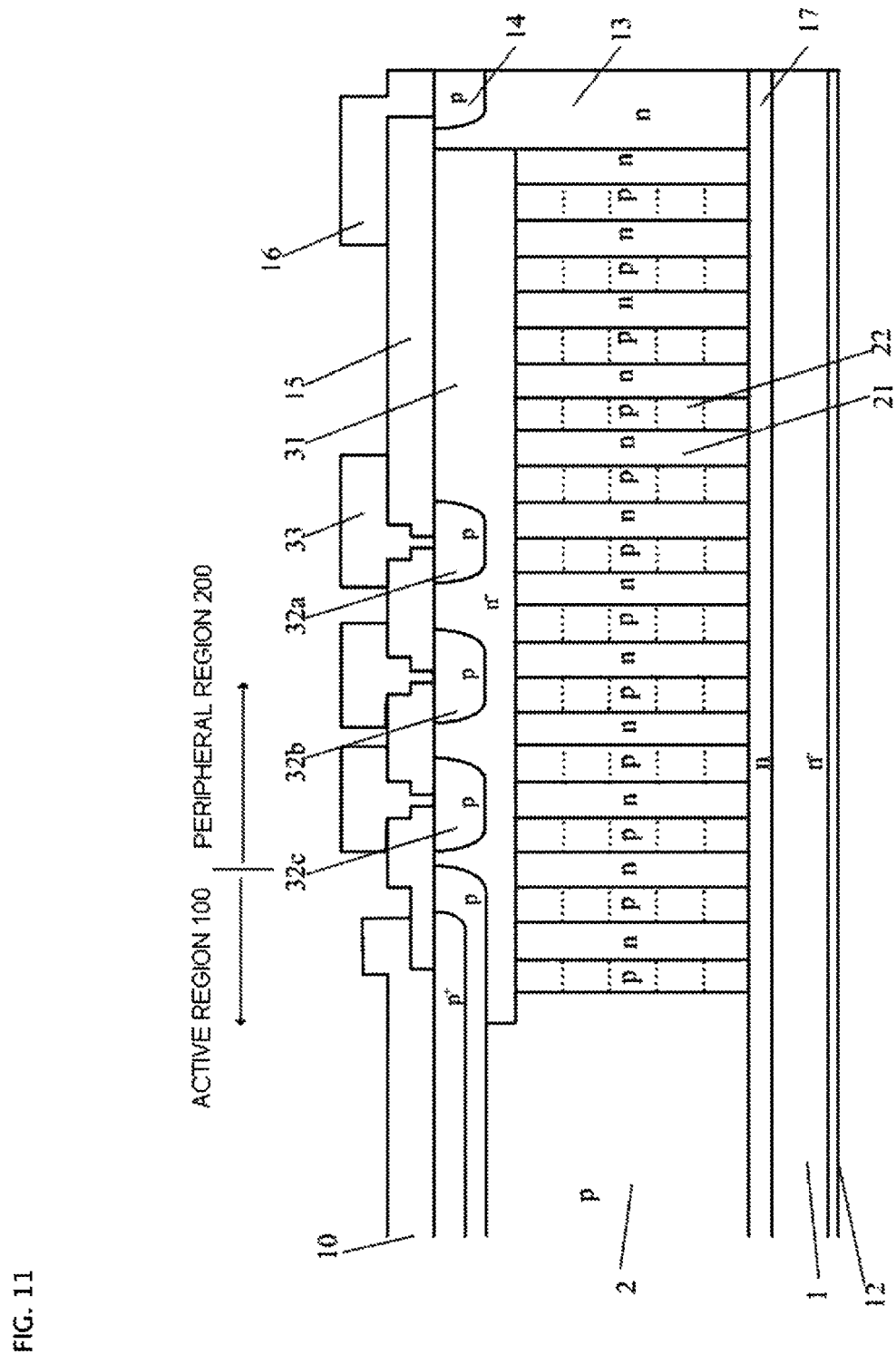
FIG. 11 is a sectional view cut along the line B-B' of FIG. 8 according to the invention.

A superjunction MOSFET according to Embodiment 2 is shown in FIGS. 8, 9, 10, and 11. FIGS. 8 and 9 show, respectively, a plan view of the superjunction MOSFET and one portion (a quarter) of a sectional view in the vicinity of a half of the depth of the parallel pn layers. FIGS. 10 and 11 are sectional views cut along the line A-A' and B-B' in FIGS. 8 and 9, respectively. In FIG. 8, in the same way as in FIG. 1, one portion of the surface portions is omitted for ease of understanding. The differences between Embodiment 1 and Embodiment 2 are that the pitch of the parallel pn layers in peripheral region 200 is smaller than that of the parallel pn layers in active region 100, and the orientation of the stripes of the parallel pn layers in peripheral region 200, with the smaller pitch, that encloses the parallel pn layers in active region 100 is perpendicular to the that of the parallel pn layers in active region 100, and each conductive field plate 33 is connected to p-type guard rings 32a, 32b, and 32c. As the electric field of n-type surface region 31 is more easily relaxed by p-type partition region 22, which has an impurity concentration gradient, when a pitch P2 of the parallel pn layers decreases, it is easy to obtain a higher breakdown voltage.

Meanwhile, as conductive field plate 33 connected to p-type guard rings 32a, 32b, and 32c acts as a collection of induced extraneous charge, as well as alleviating the electric field and suppressing the depletion layer spread of p-type guard rings 32a, 32b, and 32c, it also has a function of suppressing a fluctuation in breakdown voltage due to the charge attaching to field insulating film 15. Provided that the impurity concentration of p-type partition region 22 of the parallel pn layers in peripheral region 200 is high at the front surface side and low at the back surface side, the same advantage of high robustness against induced surface charge as in Embodiment 1 is obtained.

As heretofore described, in Embodiment 1, the structure of the superjunction MOSFET is such that the p-type partition region of the parallel pn layers, wherein the impurity concentration decreases from the front surface side toward the back surface side, is disposed below the n-type surface region in peripheral region 200 of the superjunction MOSFET that can significantly improve the trade-off relationship between the on-resistance and breakdown voltage. As the impurity concentration of the n-type surface region is increased by adopting a superjunction MOSFET with this kind of structure, the variation of the impurity concentration in the n-type surface region caused by autodoping is reduced. As the variation of the impurity concentration in the n-type surface region is reduced, a highly reliable peripheral region 200 with a high breakdown voltage is able to be provided.

Thus, a superjunction MOSFET has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

This application is based on and claims priority to Japanese Patent Application 2010-236394, filed on Oct. 21, 2010. The disclosure of the priority application in its entirety, including the drawings, claims, and the specification thereof, is incorporated herein by reference.

What is claimed is:

1. A semiconductor device having an active region through which current flows and a peripheral region which encloses the active region and maintains breakdown voltage, comprising:
a first conductivity type semiconductor substrate;
a drift layer comprising first and second conductivity type semiconductor regions of column-shape or layer-shape deposited in a vertical direction on a main surface of the first conductivity type semiconductor substrate, the drift layer comprising alternately adjacent parallel pn layers in a direction along the main surface, wherein the second conductivity type semiconductor region of the parallel pn layers has an impurity concentration distribution such that the impurity concentration decreases from the surface of the pn layers toward the semiconductor substrate side;
a first conductivity type surface region disposed on the parallel pn layers in the peripheral region;
two or more second conductivity type guard rings disposed separately from each other on the first conductivity type surface region; and
a conductive field plate disposed on each of the inner and outer circumferential side of the guard rings, and electrically connected to the surface of each of the guard rings
wherein the thickness of the first conductivity type surface region disposed on the parallel pn layers in the peripheral region is one third or less of that of the parallel pn layers in the active region.

2. The semiconductor device according to claim 1, wherein the pn layer pitch width of the parallel pn layers in the peripheral region has a smaller repeat than that of the parallel pn layers in the active region.

3. The semiconductor device according to claim 1, wherein the impurity concentration of the first conductivity type surface region disposed on the parallel pn layers in the peripheral region is in a range from $2 \times 10^{14}$/cm$^3$ to $8 \times 10^{14}$/cm$^3$.

4. The semiconductor device according to claim 2, wherein the thickness of the first conductivity type surface region disposed on the parallel pn layers in the peripheral region is one third or less of that of the parallel pn layers in the active region.

5. The semiconductor device according to claim 2, wherein the impurity concentration of the first conductivity type surface region disposed on the parallel pn layers in the peripheral region is in a range from $2 \times 10^{14}$/cm$^3$ to $8 \times 10^{14}$/cm$^3$.

6. The semiconductor device according to claim 1, wherein the parallel pn layers have the same impurity concentration and the same impurity concentration distribution in the activation region and the peripheral region.

7. The semiconductor device according to claim 2, wherein the parallel pn layers have the same impurity concentration and the same impurity concentration distribution in the activation region and the peripheral region.

* * * * *